(12) United States Patent
Behnke et al.

(10) Patent No.: US 12,100,613 B2
(45) Date of Patent: Sep. 24, 2024

(54) MINIMAL CONTACT PACKAGING FOR PROCESS CHAMBER COMPONENTS

(71) Applicant: Applied Materials, Inc., Santa Clara, CA (US)

(72) Inventors: Joseph Frederick Behnke, San Jose, CA (US); Trevor Wilantewicz, Sunnyvale, CA (US); Christopher Laurent Beaudry, San Jose, CA (US); Timothy Douglas Toth, Kalispell, MT (US); Scott Osterman, Whitefish, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 845 days.

(21) Appl. No.: 17/131,572

(22) Filed: Dec. 22, 2020

(65) Prior Publication Data

US 2022/0199455 A1 Jun. 23, 2022

(51) Int. Cl.
*H01L 21/687* (2006.01)
*B65B 31/02* (2006.01)
(Continued)

(52) U.S. Cl.
CPC ...... *H01L 21/68721* (2013.01); *B65B 31/024* (2013.01)

(58) Field of Classification Search
CPC .......... B25H 3/02; B65B 31/024; B65B 1/00; B65B 1/02; B65B 1/04; B65B 1/06;
(Continued)

(56) References Cited

U.S. PATENT DOCUMENTS

| D126,200 S | 4/1941 | Eisenberg |
|---|---|---|
| 2,501,983 A | 3/1950 | Zoie |

(Continued)

FOREIGN PATENT DOCUMENTS

| JP | 2001-332612 A | 11/2001 |
|---|---|---|
| KR | 10-2019-0007276 A | 1/2019 |
| TW | D207742 | 10/2020 |

OTHER PUBLICATIONS

International Search Report and Written Opinion for PCT/US2021/064277 dated Apr. 18, 2022.

(Continued)

*Primary Examiner* — Anthony D Stashick
*Assistant Examiner* — Marcos Javier Rodriguez Molina
(74) *Attorney, Agent, or Firm* — Moser Taboa

(57) ABSTRACT

Embodiments of packaged chamber components and methods of packaging chamber components are provided herein. In some embodiments, a packaged chamber component for use in a process chamber includes: an insert having an annular trench disposed about a raised inner portion, wherein the annular trench is disposed between the raised inner portion and an outer lip, wherein a ledge couples the raised inner portion to the outer lip, wherein the ledge includes a first portion and a second portion disposed radially outward of the first portion, and wherein the second portion includes a resting surface that extends upward and radially outward of an upper surface of the first portion; and a chamber component disposed in the annular trench of the insert and supported by the resting surface such that one or more critical surfaces of the chamber component are spaced apart from the insert.

20 Claims, 3 Drawing Sheets

(51) Int. Cl.
*C23C 16/458* (2006.01)
*H01L 21/67* (2006.01)

(58) Field of Classification Search
CPC .... B65B 1/12; B65B 1/22; B65B 1/24; B65B 1/26; B65B 1/28; B65B 1/32; B65B 1/36; B65B 1/366; B65B 11/004; B65B 11/045; B65B 11/06; B65B 11/08; B65B 11/50; B65B 11/52; B65B 11/54; B65B 11/56; B65B 13/18; B65B 13/20; B65B 17/02; B65B 19/12; B65B 19/30; B65B 2051/105; B65B 2067/1272; B65B 2210/00; B65B 2210/04; B65B 2210/06; B65B 2220/00; B65B 2220/08; B65B 2220/14; B65B 2220/16; B65B 2220/18; B65B 2220/20; B65B 2220/22; B65B 2220/24; B65B 2230/00; B65B 2230/02; B65B 23/00; B65B 23/20; B65B 25/00; B65B 25/001; B65B 25/003; B65B 25/008; B65B 25/02; B65B 25/041; B65B 25/06; B65B 25/061; B65B 25/062; B65B 25/064; B65B 25/065; B65B 25/067; B65B 25/068; B65B 25/08; B65B 25/10; B65B 25/145; B65B 25/16; B65B 25/20; B65B 25/22; B65B 27/12; B65B 27/125; B65B 29/08; B65B 29/10; B65B 3/022; B65B 3/025; B65B 3/04; B65B 3/10; B65B 3/16; B65B 31/00; B65B 31/02; B65B 31/021; B65B 31/022; B65B 31/025; B65B 31/027; B65B 31/028; B65B 31/04; B65B 31/041; B65B 31/042; B65B 31/043; B65B 31/044; B65B 31/045; B65B 31/046; B65B 31/047; B65B 31/048; B65B 31/06; B65B 31/08; B65B 35/02; B65B 35/06; B65B 35/10; B65B 35/18; B65B 35/20; B65B 35/205; B65B 35/24; B65B 35/28; B65B 35/30; B65B 35/34; B65B 35/36; B65B 35/40; B65B 35/44; B65B 35/50; B65B 35/52; B65B 35/56; B65B 35/58; B65B 37/04; B65B 37/10; B65B 37/18; B65B 39/00; B65B 39/02; B65B 39/06; B65B 41/00; B65B 41/06; B65B 41/12; B65B 41/14; B65B 41/16; B65B 41/18; B65B 43/04; B65B 43/08; B65B 43/12; B65B 43/123; B65B 43/16; B65B 43/18; B65B 43/185; B65B 43/265; B65B 43/28; B65B 43/30; B65B 43/32; B65B 43/36; B65B 43/40; B65B 43/42; B65B 43/46; B65B 43/465; B65B 43/50; B65B 43/52; B65B 43/54; B65B 43/58; B65B 43/60; B65B 45/00; B65B 47/00; B65B 47/02; B65B 47/04; B65B 47/10; B65B 49/08; B65B 49/16; B65B 5/00; B65B 5/02; B65B 5/022; B65B 5/024; B65B 5/026; B65B 5/04; B65B 5/045; B65B 5/06; B65B 5/061; B65B 5/067; B65B 5/068; B65B 5/08; B65B 51/00; B65B 51/02; B65B 51/023; B65B 51/04; B65B 51/046; B65B 51/067; B65B 51/10; B65B 51/14; B65B 51/146; B65B 51/148; B65B 51/16; B65B 51/18; B65B 51/22; B65B 51/225; B65B 51/30; B65B 51/303; B65B 51/32; B65B 53/00; B65B 53/02; B65B 53/04; B65B 53/063; B65B 55/00; B65B 55/02; B65B 55/027; B65B 55/08; B65B 55/10; B65B 55/103; B65B 55/14; B65B 55/16; B65B 55/18; B65B 55/19; B65B 55/20; B65B 55/22; B65B 55/24; B65B 57/00; B65B 57/005; B65B 57/02; B65B 57/04; B65B 57/10; B65B 57/12; B65B 57/14; B65B 57/145; B65B 57/16; B65B 57/18; B65B 59/00; B65B 59/001; B65B 59/003; B65B 59/005; B65B 59/02; B65B 59/04; B65B 61/00; B65B 61/005; B65B 61/02; B65B 61/025; B65B 61/04; B65B 61/06; B65B 61/065; B65B 61/08; B65B 61/10; B65B 61/18; B65B 61/182; B65B 61/184; B65B 61/186; B65B 61/188; B65B 61/20; B65B 61/22; B65B 61/24; B65B 61/26; B65B 61/28; B65B 63/00; B65B 63/02; B65B 63/026; B65B 63/028; B65B 63/04; B65B 63/045; B65B 63/08; B65B 65/00; B65B 65/003; B65B 65/006; B65B 65/02; B65B 65/06; B65B 65/08; B65B 67/1266; B65B 69/00; B65B 69/008; B65B 69/005; B65B 7/02; B65B 7/025; B65B 7/06; B65B 7/08; B65B 7/16; B65B 7/164; B65B 7/165; B65B 7/26; B65B 7/28; B65B 7/2821; B65B 7/2835; B65B 7/2842; B65B 7/285; B65B 7/2878; B65B 9/02; B65B 9/026; B65B 9/04; B65B 9/042; B65B 9/045; B65B 9/06; B65B 9/067; B65B 9/073; B65B 9/08; B65B 9/087; B65B 9/093; B65B 9/10; B65B 9/13; B65B 9/15; B65B 9/20; B65B 9/2028; B65B 9/2056; B65B 9/207; B65B 9/213; B65D 25/10; B65D 25/24; B65D 25/2823; B65D 81/02; B65D 81/2007; B65D 85/54; B65D 85/64; B65D 1/20; B65D 1/34; B65D 1/40; B65D 11/00; B65D 11/08; B65D 11/22; B65D 15/16; B65D 15/18; B65D 17/4011; B65D 17/404; B65D 19/44; B65D 21/0209; B65D 21/0219; B65D 21/022; B65D 2203/12; B65D 2205/00; B65D 2205/02; B65D 2205/025; B65D 2251/0015; B65D 2251/0018; B65D 2251/0021; B65D 2251/0025; B65D 2251/0028; B65D 2251/0046; B65D 2251/0059; B65D 2251/0075; B65D 2251/0078; B65D 2251/0081; B65D 2251/0087; B65D 2251/009; B65D 2251/0093; B65D 2251/08; B65D 23/00; B65D 23/12; B65D 2401/15; B65D 2401/30; B65D 2401/35; B65D 25/02; B65D 25/04; B65D 25/082; B65D 25/107; B65D 25/14; B65D 25/16; B65D 25/18; B65D 25/20; B65D 25/22; B65D 25/2817; B65D 25/2894; B65D 25/52; B65D 2519/00815; B65D 2525/283; B65D 2543/00046; B65D 2543/00092; B65D 2543/00231; B65D 2543/00277; B65D 2543/00296; B65D 2543/00314; B65D 2543/00361; B65D 2543/0037; B65D 2543/00416; B65D 2543/00462; B65D 2543/0049; B65D 2543/00509; B65D 2543/00518; B65D 2543/00527; B65D 2543/00537; B65D 2543/00546; B65D 2543/00564; B65D 2543/00629; B65D 2543/00685; B65D 2543/0074; B65D
2543/00796; B65D 2543/00805; B65D
2543/00833; B65D 2543/00842; B65D
2543/00851; B65D 2543/00879; B65D
2543/00925; B65D 2543/00972; B65D
2571/00901; B65D 33/00; B65D 33/01;
B65D 33/2508; B65D 33/2541; B65D
33/259; B65D 39/02; B65D 39/08; B65D
39/086; B65D 39/16; B65D 41/04; B65D
41/0435; B65D 41/045; B65D 41/06;
B65D 41/08; B65D 41/18; B65D 41/20;
B65D 41/28; B65D 41/3423; B65D
41/3428; B65D 41/348; B65D 41/3485;
B65D 41/48; B65D 41/58; B65D 43/02;
B65D 43/0202; B65D 43/0212; B65D
43/0214; B65D 43/022; B65D 43/0229;
B65D 43/0231; B65D 43/0256; B65D
43/0283; B65D 43/163; B65D 43/20;
B65D 45/02; B65D 45/30; B65D 47/06;
B65D 47/0857; B65D 47/0871; B65D
47/0895; B65D 47/121; B65D 47/122;
B65D 47/0275; B65D 47/2081; B65D
47/243; B65D 47/286; B65D 47/32;
B65D 47/36; B65D 49/04; B65D 50/041;
B65D 50/043; B65D 51/00; B65D
51/002; B65D 51/145; B65D 51/16;
B65D 51/1616; B65D 51/1644; B65D
51/1661; B65D 51/1677; B65D 51/1683;
B65D 51/18; B65D 51/20; B65D 51/24;
B65D 51/242; B65D 51/248; B65D
53/02; B65D 53/04; B65D 55/02; B65D
55/024; B65D 55/0854; B65D 55/0863;
B65D 61/00; B65D 7/04; B65D 7/045;
B65D 71/70; B65D 75/002; B65D
75/004; B65D 75/30; B65D 75/305;
B65D 75/325; B65D 75/5838; B65D
75/5855; B65D 77/04; B65D 77/0406;
B65D 77/12; B65D 77/2024; B65D
77/30; B65D 79/00; B65D 79/005; B65D
79/0081; B65D 79/0087; B65D 79/02;
B65D 81/03; B65D 81/051; B65D
81/052; B65D 81/18; B65D 81/20; B65D
81/2015; B65D 81/2023; B65D 81/203;
B65D 81/2038; B65D 81/2069; B65D
81/2076; B65D 81/263; B65D 81/264;
B65D 81/266; B65D 81/267; B65D
81/28; B65D 81/3261; B65D 81/3272;
B65D 81/34; B65D 81/3453; B65D
81/365; B65D 81/38; B65D 81/3806;
B65D 81/3818; B65D 81/3841; B65D
81/3869; B65D 81/3881; B65D 83/0805;
B65D 85/04; B65D 85/38; B65D 85/50;
B65D 85/544; B65D 85/671; B65D
85/70; B65D 85/72; B65D 88/12; B65D
88/744; B65D 88/745; B65D 88/78;
B65D 90/00; B65D 90/022; B65D 90/10;
B65D 90/12; B65D 90/22; B65D 90/24;
B65D 90/32; B65D 90/34; B65D 90/503;
C23C 16/4585; C23C 14/0021; C23C
14/0641; C23C 14/12; C23C 14/20; C23C
14/228; C23C 14/24; C23C 14/325; C23C
14/3407; C23C 14/3414; C23C 14/546;
C23C 14/547; C23C 16/045; C23C 16/26;
C23C 16/30; C23C 16/36; C23C 16/401;
C23C 16/45589; C23C 16/507; C23C 16/52; C23C 18/1216; H01L 21/6719;
H01L 21/68721; H01L 21/68785; H01L
21/67005; H01L 13/0069; H05K 13/0069
USPC ........ 53/52, 79, 86, 173, 405, 408, 432, 434,
53/436, 443, 447, 449, 452, 467, 473,
53/492, 509, 510, 511, 512, 556;
206/349, 372, 408, 440, 459.1, 459.5,
206/461, 471, 484.1, 484.2, 486, 494,
206/524.1, 524.8, 706, 829, 0.5, 0.84, 1.7,
206/5.1, 6, 6.1, 37, 38, 45.21, 63.3, 68,
206/83.5, 194, 204, 205, 209.1, 210,
206/213.1, 216, 217, 219, 222, 223, 264,
206/274, 278, 303, 307, 307.1, 308.1,
206/315.1, 320, 335, 338, 348, 362.3,
206/363, 364, 367, 379, 388, 423, 425,
206/427, 431, 438, 442, 443, 446, 447,
206/449, 454, 455, 457, 458, 462, 463,
206/467, 469, 472, 473, 476, 477, 484,
206/485.1, 487, 488, 495, 497, 499, 509,
206/511, 516, 518, 519, 521, 522, 523,
206/524, 524.2, 524.3, 524.5, 524.6,
206/524.7, 525, 526, 527, 528, 539, 541,
206/557, 560, 562, 564, 565, 566, 570,
206/581, 583, 584, 588, 589, 590, 591,
206/592, 594, 701, 710, 711, 712, 714,
206/720, 721, 722, 736, 747, 763, 765,
206/775, 778, 779, 783, 804, 806, 807,
206/813, 820, 832; 220/23.83, 200, 265,
220/281, 296, 300, 305, 624, 798, 803,
220/804, 806, 833, 849, 2.2, 4.06, 4.07,
220/4.21, 4.24, 4.27, 9.1, 62.11, 62.18,
220/89.1, 89.2, 89.3, 203.04, 203.07,
220/203.1, 203.11, 203.12, 203.16,
220/203.24, 203.26, 203.28, 212, 212.5,
220/214, 231, 232, 239, 240, 254.1,
220/254.5, 254.9, 256.1, 258.5, 260, 266,
220/269, 270, 271, 272, 276, 278, 285,
220/287, 288, 303, 314, 315, 319, 324,
220/325, 359.1, 359.3, 359.4, 361, 364,
220/366.1, 378, 495.01, 501, 503, 504,
220/507, 524, 580, 592.01, 592.17,
220/592.19, 592.21, 592.27, 601, 609,
220/611, 612, 614, 619, 626, 630, 632,
220/661, 663, 677, 735, 784, 788, 790,
220/795, 796, 2.1 A, 2.1 R, 2.3 A, 2.3 R,
220/DIG. 1, DIG. 32; 383/44, 63, 100,
383/101, 105, 109; 604/28, 385.01,
604/385.02, 414, 416, 500; 216/2, 6, 12,
216/13, 17, 18, 22, 24, 37, 38, 39, 41, 42,
216/47, 49, 50, 53, 55, 56, 57, 58, 59, 60,
216/61, 63, 64, 66, 67, 68, 69, 71, 79, 83,
216/84, 88, 89, 90, 91, 92, 95, 96, 100,
216/105
See application file for complete search history.

(56) References Cited

U.S. PATENT DOCUMENTS

| | | |
|---|---|---|
| 3,414,183 A | 12/1968 | Wilcox |
| 3,429,369 A | 2/1969 | Segal |
| 3,694,991 A | 10/1972 | Perdue et al. |
| D260,492 S | 9/1981 | Scott |
| D262,932 S | 2/1982 | Daenen |
| D281,758 S | 12/1985 | Trombly |
| D398,997 S | 9/1998 | Taylor |
| D411,800 S | 7/1999 | Kokenge et al. |

(56) References Cited

U.S. PATENT DOCUMENTS

| | | |
|---|---|---|
| D434,660 S | 12/2000 | Conti |
| D445,687 S | 7/2001 | Gilbertson |
| D483,989 S | 12/2003 | Lillelund et al. |
| D526,564 S | 8/2006 | Slavin et al. |
| D595,570 S | 7/2009 | Moretti |
| D618,500 S | 6/2010 | Hardaway |
| D625,190 S | 10/2010 | Pontes |
| D627,226 S | 11/2010 | Gonzalez Sanchez et al. |
| 8,266,873 B2 | 9/2012 | Berbert et al. |
| D677,162 S | 3/2013 | Sharma et al. |
| D825,505 S | 8/2018 | Hanson et al. |
| D877,558 S | 3/2020 | Dorfmueller |
| D934,315 S | 10/2021 | Lavitsky et al. |
| D942,516 S | 2/2022 | Koppa et al. |
| D943,345 S | 2/2022 | Lofholm et al. |
| D944,083 S | 2/2022 | Boggs et al. |
| D944,484 S | 2/2022 | Hornbaker et al. |
| D947,675 S | 4/2022 | Yamada |
| D951,091 S | 5/2022 | Bontrager |
| D955,217 S | 6/2022 | Choi |
| D959,896 S | 8/2022 | Sun |
| 2004/0074790 A1* | 4/2004 | Kuremoto .......... G11B 33/0427 |
| 2006/0011509 A1* | 1/2006 | White ................ H05K 13/0084 206/719 |
| 2006/0016156 A1* | 1/2006 | Bush .................. B65D 77/0446 53/469 |
| 2013/0213853 A1 | 8/2013 | Brautigam et al. |
| 2016/0068288 A1 | 3/2016 | Palumbo |

OTHER PUBLICATIONS

CAE Online. Used Amat / Applied Materials Etch Chamber for MXP #9222737 for Sale. No date specified. https://caeonline.com/buy/spare-parts/amat-applied-materials-etch-chamber-for-mxp/9222737 (Year: 0).

MRE Depot. Plastic Reusable Lids for #10 Cans (6 Pack). No date specified. https://www.mredepot.com/10-can-plastic-lids-p/fe005.htm (Year: 0).

Berlin Packaging. 307 Metal Paint Can Lid (Epoxy Liner). No date specified. https://www.berlinpackaging.com/7713-307-metal-paint-can-lid-epoxy-liner/?promo=shopping&gclid=EAIaIQobChMI2N3_9KaU9gIVBYizCh3M HQI EAQYCyABEg KZXfD_BwE (Year: 0).

Search Report for Taiwan Design Application No. 110303137, dated Oct. 29, 2021.

* cited by examiner

MINIMAL CONTACT PACKAGING FOR PROCESS CHAMBER COMPONENTS

FIELD

Embodiments of the present disclosure generally relate to packaging of components for use in substrate process equipment.

BACKGROUND

Process chambers for processing substrates, such as semiconductor substrates, typically include various chamber components. For example, process chambers may use annular rings such as edge rings, cover rings, deposition rings, quartz rings. When chamber components are manufactured, they are typically packaged or bagged in a clean room environment. However, when chamber components are transported, interaction between the chamber components and the packaging may leave behind unwanted particles of the packaging materials and/or particles of the chamber component itself onto the chamber component. These unwanted particles may contaminate the chamber components Therefore, the inventors have provided improved packaging for chamber components for use in a process chamber.

SUMMARY

Embodiments of packaged chamber components and methods of packaging chamber components are provided herein. In some embodiments, a packaged chamber component for use in a process chamber includes: an insert having an annular trench disposed about a raised inner portion, wherein the annular trench is disposed between the raised inner portion and an outer lip, wherein a ledge couples the raised inner portion to the outer lip, wherein the ledge includes a first portion and a second portion disposed radially outward of the first portion, and wherein the second portion includes a resting surface that extends upward and radially outward of an upper surface of the first portion; and a chamber component disposed in the annular trench of the insert and supported by the resting surface such that one or more critical surfaces of the chamber component are spaced apart from the insert.

In some embodiments, a packaged chamber component for use with a process chamber includes: an insert made of a polymer material having an annular trench, wherein the annular trench is defined by a raised inner portion, a ledge extending radially outward from the raised inner portion, and an outer lip extending from the ledge, wherein the ledge includes a first portion and a second portion disposed radially outward of the first portion, wherein the second portion includes a resting surface that is raised from an upper surface of the first portion; and a chamber component having an annular body disposed in the annular trench and supported by the resting surface such that a radially inner surface of the annular body and at least a portion of a ledge-facing surface of the annular body are spaced apart from the insert.

In some embodiments, a method of packaging a chamber component for use with a process chamber includes: placing the chamber component in an annular trench of an insert made of a polymer material, wherein the chamber component includes a critical surface, and wherein the annular trench includes one or more resting surfaces on a lower surface thereof for supporting the chamber component without touching the critical surface of the chamber component; placing the chamber component and the insert in a bag made of a polymer material; and vacuum sealing the chamber component and the insert in the bag to clamp the chamber component between the bag and the one or more resting surfaces.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 depicts broken side view in cross-section of an insert for supporting a chamber component in accordance with some embodiments of the present disclosure.

FIG. 4 depicts a partial side view in cross-section of a portion of an insert for supporting a chamber component in accordance with some embodiments of the present disclosure.

Figure 1:
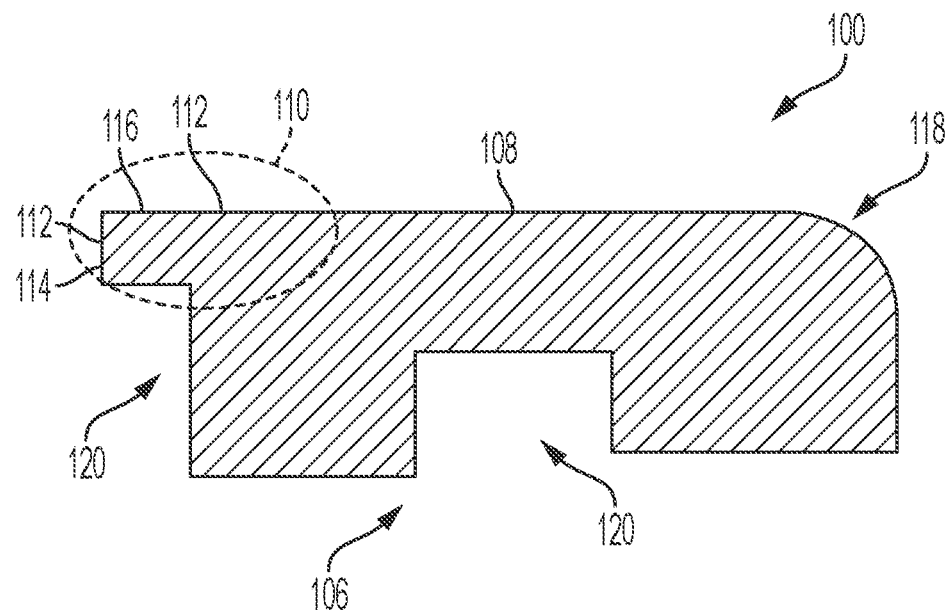
FIG. 1 depicts a cross-sectional partial side view of a chamber component in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of packaged chamber components and methods of packaging chamber components are provided herein. The packaging for a chamber component generally comprises an insert configured to support the chamber component without contacting critical surfaces of the chamber component. A bag may envelope the chamber component and the insert to seal the chamber component. Critical surfaces of the chamber component can be, for example, surfaces proximate a substrate during use in a process chamber. For example, in a plasma process chamber, when a substrate is raised or lowered with respect to the chamber component, a difference in voltage potential between the substrate and the chamber component may cause particles disposed on the critical surfaces to migrate from the chamber component to the substrate, contaminating the substrate.

FIG. 1 depicts a cross-sectional partial side view of a chamber component in accordance with some embodiments of the present disclosure. The chamber component 100 may be an annular body for use in an etch chamber. For example, the chamber component 100 may be a ring disposed about or disposed on a substrate support of a process chamber. However, the chamber component 100 may be other components suitable for being used in a process chamber, for example liners, process kits, or the like. In some embodiments, the chamber component 100 is a quartz ring. The chamber component 100 includes an upper surface 108 and a lower surface 106. In some embodiments, the upper surface 108 is substantially horizontal. In some embodiments, the lower surface 106 includes one or more recesses 120 (two shown in FIG. 1).

The chamber component 100 includes one or more critical surfaces 112 disposed in a critical region 110 of the chamber component 100. The critical region 110 may correspond with an area of the chamber component 100 that if covered with unwanted particles, could contaminate a substrate being process or other chamber components. As shown in FIG. 1, the one or more critical surfaces 112 can include at least one of a radially inner surface 114 of the chamber component 100 or at least a portion 116 of an upper surface 108 of the chamber component 100. However, in some embodiments, other surfaces of the chamber component 100 may be deemed as the one or more critical surfaces 112.

In some embodiments, the portion 116 is a radially inner portion that extends to the radially inner surface 114. In some embodiments, the radially inner surface 114 and the portion 116 of the upper surface 108 meet to form a sharp corner that may be prone to wear if packaging material were to contact the sharp corner. The packaging apparatus and methods described herein avoid contacting the one or more critical surfaces 112 to advantageously prevent wear of the chamber component 100 and particle formation. In some embodiments, the one or more critical surfaces 112 may include the upper surface 108 except for an outer peripheral edge 118 of the chamber component 100. In some embodiments, the outer peripheral edge 118 is rounded.

Figure 2:
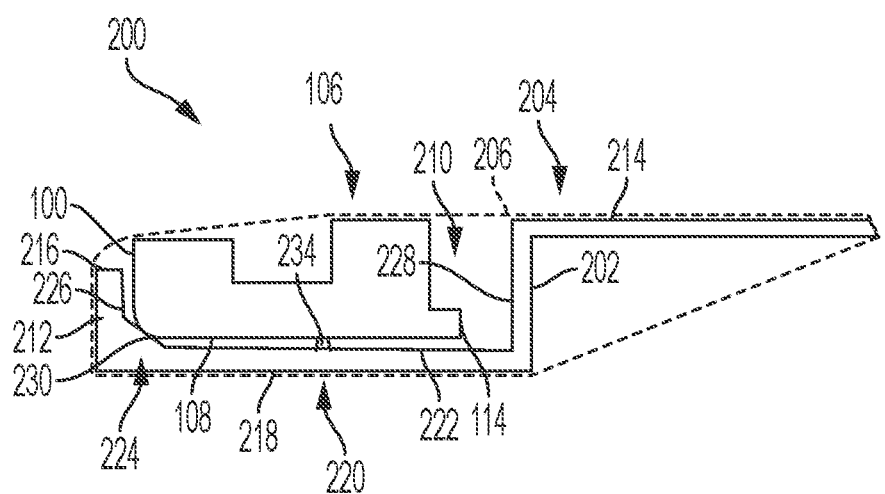
FIG. 2 depicts a partial side view of a packaged chamber component for use in a process chamber in accordance with some embodiments of the present disclosure.

FIG. 2 depicts a partial side view of a packaged chamber component 200 for use in a process chamber in accordance with some embodiments of the present disclosure. The packaged chamber component 200 includes the chamber component 100 disposed in an insert 202 such that the insert 202 does not contact the one or more critical surfaces 112 of the chamber component 100. In some embodiments, the insert 202 is made of a polymer material. In some embodiments, the polymer material comprises at least one of acrylic, polycarbonate, polypropylene, acrylonitrile butadiene styrene, or polyethylene terephthalate.

The insert 202 generally includes a raised inner portion 204 and an annular trench 210 disposed about the raised inner portion 204. In some embodiments, the annular trench 210 is defined between the raised inner portion 204 and an outer lip 212. A ledge 218 extends radially outward from the raised inner portion 204 to the outer lip 212 to couple the raised inner portion 204 to the outer lip 212. In some embodiments, an upper surface 214 of the raised inner portion 204 is raised with respect to an upper surface 216 of the outer lip 212.

The annular trench 210 may be sized to accommodate a size of the chamber component 100. For example, in some embodiments, the outer lip 212 has an inner diameter of about 13.0 inches to about 18.0 inches. In some embodiments, the raised inner portion 204 has an outer diameter of about 8.0 inches to about 12.0 inches. In some embodiments, the raised inner portion 204 is raised about 0.8 inches to about 2.0 inches from the ledge 218.

The ledge 218 includes a first portion 220 and a second portion 224 disposed radially outward of the first portion 220. The second portion 224 includes a resting surface 230 (i.e., upper surface of second portion 224) to accommodate the chamber component 100. In some embodiments, the resting surface 230 is raised from an upper surface 222 of the first portion 220 so that the chamber component 100 advantageously does not contact the upper surface 222. For example, the resting surface 230 may extend upward and radially outward from the upper surface 222 of the first portion 220. The resting surface 230 may be stepped from the upper surface 222 or may incline from the upper surface 222. In some embodiments, the resting surface 230 inclines radially outward and upward at an angle of about 25 degrees to about 65 degrees to an inner surface 226 of the outer lip 212. In some embodiments, a width of the second portion 224 is about 20 percent to about 40 percent of a width of the first portion 220.

The chamber component 100 is disposed in the annular trench 210 of the insert 202 and supported by the resting surface 230. In some embodiments, the chamber component 100 is disposed upside-down in the annular trench 210 (i.e., with the upper surface 108 of the chamber component 100 facing the ledge 218. The chamber component 100 is supported such that the one or more critical surfaces 112 of the chamber component 100 are spaced apart from the insert 202. In some embodiments, the one or more critical surfaces 112 includes at least a portion of a ledge-facing surface (i.e., upper surface 108) of the chamber body.

In some embodiments, the chamber component 100 rests solely on the resting surface 230 and does not contact the insert 202 otherwise. In some embodiments, the insert 202 includes a second resting surface 234 raised from the upper surface 222 of the first portion 220 of the ledge 218 at a location radially outward of the one or more critical surfaces 112 to further support the chamber component 100 if needed. In such embodiments, the chamber component 100 may rest on the resting surface 230 and the second resting surface 234. In some embodiments, an outer surface 228 of the raised inner portion 204 has a diameter less than an inner diameter of the chamber component 100 to form a gap therebetween. In some embodiments, the gap is about 1.0 inches to about 3.0 inches so that the chamber component 100 does not contact the outer surface 228

In some embodiments, the insert 202 and the chamber component 100 are disposed in a bag 206. In some embodiments, the bag 206 is made of a polymer such as polyethylene. The bag 206 may be vacuum sealed to clamp the chamber component 100 against the insert 202 and advantageously minimize movement of the chamber component 100 within the annular trench 210. The resting surface 230 having an inclined surface may advantageously aid in clamping the chamber component 100 against the insert 202. The bag 206 is also configured to keep the chamber component 100 clean and substantially free from unwanted particles. The bag 206 envelopes the chamber component 100 and the insert 202 without contacting the one or more critical surfaces 112 of the chamber component 100. For example, the bag 206 is spaced from the radially inner surface 114 of the annular body and the portion 116 of the ledge-facing surface of the annular body of the chamber component. In some embodiments, the bag 206 only contacts one or more surfaces of the chamber component 100 that face away from a floor the upper surface 222 and resting surface 230 of the ledge 218) or sidewalls (i.e., outer surface 228 and inner surface 226) of the annular trench 210. For example, in some embodiments, the bag 206 only contacts one or more surfaces along the lower surface 106 of the chamber component 100.

Figures 3, 4:
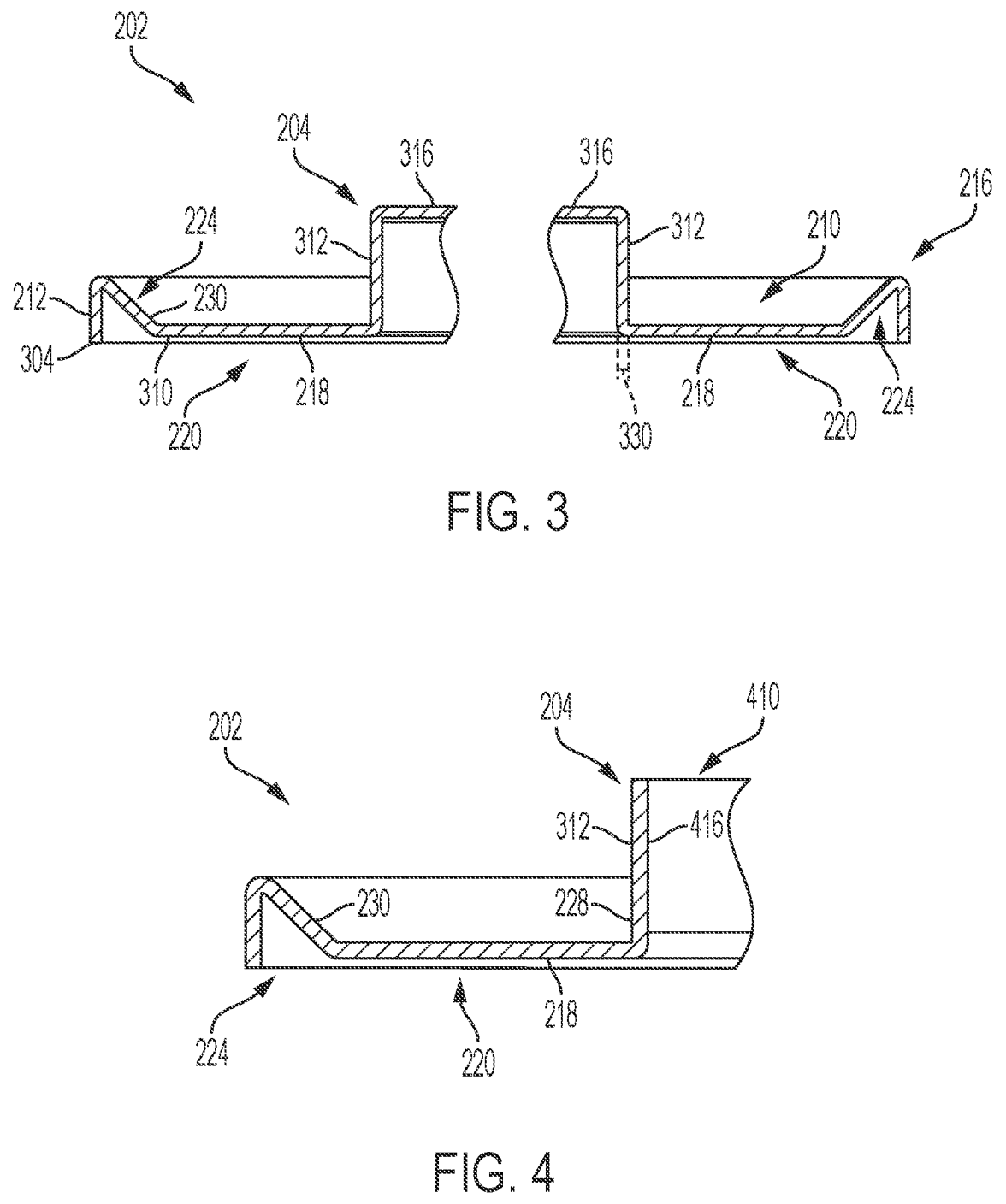

FIG. 3 depicts broken side view in cross-section of an insert for supporting a chamber component in accordance with some embodiments of the present disclosure. In some embodiments, the ledge 218 is coupled to an upper surface 216 of the outer lip 212 and the outer lip 212 extends downward from the second portion 224 of the ledge 218. In some embodiments, a lower surface 310 of the ledge 218 is disposed vertically between a lower surface 304 of the outer lip 212 and the upper surface 216 of the outer lip 212. In some embodiments, as shown in FIG. 3, the raised inner portion 204 includes a sidewall 312 and an upper plate 316. In some embodiments, the sidewall 312 extends substantially vertically from the ledge 218 to the upper plate 316.

FIG. 4 depicts a side view in cross-section of a portion of an insert for supporting a chamber component in accordance with some embodiments of the present disclosure. In some embodiments, as shown in FIG. 4, the raised inner portion 204 includes a sidewall 312 and a central opening 410. In some embodiments, an inner surface 416 of the raised inner portion 204 defines the central opening 410 (i.e., no upper plate 316). In some embodiments, the central opening 410 has a diameter less than a diameter across the inner surface 416 of the raised inner portion 204 (i.e., having an upper plate 316 with the central opening 410).

With respect to FIGS. 3 and 4, in some embodiments, a cross-sectional thickness 330 of the raised inner portion 204, the ledge 218, and the outer lip 212 is substantially the same. In some embodiments, substantially is within about 10 percent. In some embodiments, the cross-sectional thickness is about 0.05 inches to about 0.2 inches. In some embodiments, an outer diameter of the insert 202 is about 13.0 inches to about 19.0 inches.

Figure 5:
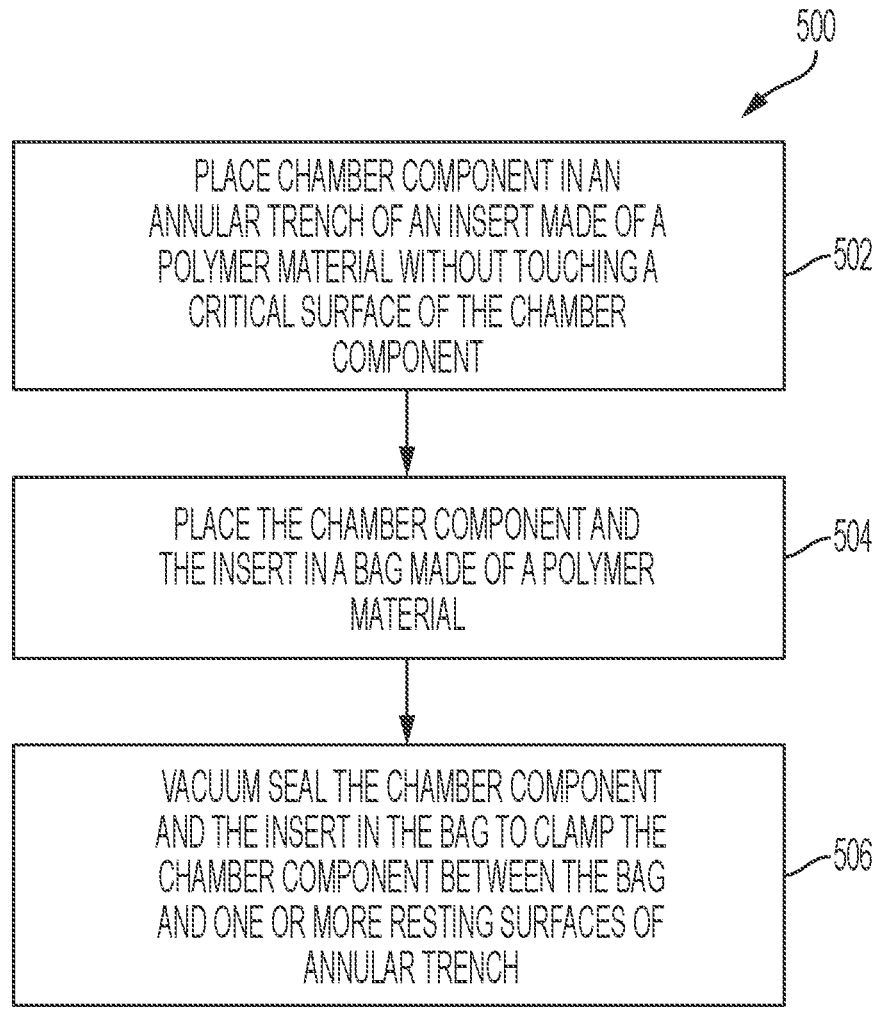
FIG. 5 depicts a flow chart of a method of packaging a chamber component in accordance with some embodiments of the present disclosure.

FIG. 5 depicts a flow chart of a method 500 of packaging a chamber component (i.e., chamber component 100) for use with a process chamber in accordance with some embodiments of the present disclosure. In some embodiments, the chamber component is a quartz ring.

At 502, the method 500 includes placing the chamber component in an annular trench (i.e., annular trench 210) of an insert (i.e., insert 202). In some embodiments, the insert is made of a polymer material. The chamber component includes one or more critical surfaces (i.e., critical surfaces 112) that are spaced from the insert when the chamber component is placed in the insert. The annular trench includes one or more resting surfaces (i.e., resting surface 230 and second resting surface 234) on a lower surface thereof for supporting the chamber component without touching the one or more critical surfaces of the chamber component. In some embodiments, the one or more critical surface comprises at least one of a radially inner surface of the chamber component and at least a portion of an upper surface of the chamber component. In some embodiments, the one or more resting surfaces include one resting surface that is disposed at a radially outer portion (i.e., resting surface 230) of the lower surface of the annular trench and that is raised from a remaining portion (i.e., upper surface 222 of first portion 220 of ledge 218) of the lower surface.

In some embodiments, the method 500 comprises turning the chamber component upside-down prior to placing the chamber component in the annular trench such that an upper surface (i.e., upper surface 108) of the chamber component faces the lower surface of the annular trench.

At 504, the method 500 includes placing the chamber component and the insert in a bag (i.e., bag 206) made of a polymer material. The chamber component and the insert may be advantageously placed in the bag in a clean room to reduce particle formation on the chamber component. At 506, the method 500 includes vacuum sealing the chamber component and the insert in the bag to clamp the chamber component between the bag and the one or more resting surfaces. In some embodiments, the bag contacts only one or more surfaces along a lower surface (i.e., lower surface 106) of the chamber component.

While the foregoing is directed to embodiments of the present disclosure, other and further embodiments of the disclosure may be devised without departing from the basic scope thereof.

The invention claimed is:

1. A packaged chamber component for use in a process chamber, comprising:
   an insert having an annular trench disposed about a raised inner portion, wherein the annular trench is disposed between the raised inner portion and an outer lip, wherein a ledge couples the raised inner portion to the outer lip, wherein the ledge includes a first portion and a second portion disposed radially outward of the first portion, and wherein the second portion includes a resting surface that extends upward and radially outward of an upper surface of the first portion; and
   a chamber component disposed in the annular trench of the insert and supported by the resting surface such that one or more critical surfaces of the chamber component are spaced apart from the insert, wherein an innermost diameter of the chamber component is greater than an outermost diameter of the raised inner portion.

2. The packaged chamber component of claim 1, wherein the insert is made of a polymer material.

3. The packaged chamber component of claim 1, wherein at least one of:
   the outer lip has an inner diameter of about 15.1 inches to about 18.0 inches, or
   the raised inner portion has an outer diameter of about 8.0 inches to about 12.0 inches.

4. The packaged chamber component of claim 1, wherein the raised inner portion comprises an annular sidewall and a central opening disposed at a lower surface of the annular sidewall.

5. The packaged chamber component of claim 1, wherein the one or more critical surfaces include a radially inner surface of the chamber component and at least a portion of a ledge-facing surface of the chamber component.

6. The packaged chamber component of claim 1, wherein the ledge has a lower surface that is flat from the raised inner portion to the resting surface.

7. The packaged chamber component of claim 1, wherein the outer lip extends downward from the ledge.

8. A packaged chamber component for use with a process chamber, comprising:
   an insert made of a polymer material having an annular trench, wherein the annular trench is defined by a raised inner portion, a ledge extending radially outward from the raised inner portion, and an outer lip extending from the ledge, wherein the ledge includes a first portion and a second portion disposed radially outward of the first portion, wherein the second portion includes a resting surface that is raised from an upper surface of the first portion; and
   a chamber component having an annular body disposed in the annular trench and supported by the resting surface such that a radially inner surface of the annular body and at least a portion of a ledge-facing surface of the annular body are spaced apart from the insert, wherein the chamber component extends from the resting surface to vertically beyond an upper surface of the outer lip.

9. The packaged chamber component of claim 8, wherein the polymer material comprises at least one of acrylic, polycarbonate, polypropylene, acrylonitrile butadiene styrene, or polyethylene terephthalate.

10. The packaged chamber component of claim 8, wherein the insert and the chamber component are disposed in a bag that is vacuum sealed, wherein the bag clamps the chamber component against the insert, and wherein the bag is spaced from the radially inner surface of the annular body and the portion of the ledge-facing surface of the annular body of the chamber component.

11. The packaged chamber component of claim 10, wherein the bag is made of polyethylene.

12. The packaged chamber component of claim 10, wherein the bag only contacts one or more surfaces of the chamber component that face away from a floor or sidewalls of the annular trench.

13. The packaged chamber component of claim 8, wherein an upper surface of the raised inner portion is raised with respect to an upper surface of the outer lip.

14. The packaged chamber component of claim 8, wherein the resting surface inclines radially outward and upward from an upper surface of the first portion of the ledge.

15. The packaged chamber component of claim 8, wherein the insert includes a second resting surface raised from the upper surface of the first portion of the ledge, and wherein the chamber component rests on the resting surface and the second resting surface.

16. A method of packaging a chamber component for use with a process chamber, comprising:

placing the chamber component in an annular trench of an insert made of a polymer material, wherein an innermost diameter of the chamber component is greater than an outermost diameter of a raised inner portion of the insert, wherein the chamber component includes a critical surface, and wherein the annular trench includes one or more resting surfaces on a lower surface thereof for supporting the chamber component without touching the critical surface of the chamber component;

placing the chamber component and the insert in a bag made of a polymer material; and vacuum sealing the chamber component and the insert in the bag to clamp the chamber component between the bag and the one or more resting surfaces.

17. The method of claim 16, wherein the critical surface comprises at least one of a radially inner surface of the chamber component and at least a portion of an upper surface of the chamber component.

18. The method of claim 16, further comprising turning the chamber component upside-down prior to placing the chamber component in the annular trench such that an upper surface of the chamber component faces the lower surface of the annular trench.

19. The method of claim 16, wherein the one or more resting surfaces includes one resting surface that is disposed at a radially outer portion of the lower surface of the annular trench and that is raised from a remaining portion of the lower surface.

20. The method of claim 16, wherein the chamber component is a quartz ring having a non-planar lower surface.

* * * * *